United States Patent
Chou et al.

(10) Patent No.: US 10,138,118 B2
(45) Date of Patent: Nov. 27, 2018

(54) STRUCTURE TO REDUCE BACKSIDE SILICON DAMAGE

(71) Applicant: Taiwan Semiconductor Manufacturing Co., Ltd., Hsin-Chu (TW)

(72) Inventors: Chung-Yen Chou, Hsinchu (TW); Chih-Jen Chan, Changhua (TW); Chia-Shiung Tsai, Hsin-Chu (TW); Ru-Liang Lee, Hsinchu (TW); Yuan-Chih Hsieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/671,647

(22) Filed: Aug. 8, 2017

(65) Prior Publication Data

US 2017/0355598 A1    Dec. 14, 2017

Related U.S. Application Data

(62) Division of application No. 14/699,094, filed on Apr. 29, 2015, now Pat. No. 9,738,516.

(51) Int. Cl.
*B81C 1/00* (2006.01)
*B81B 7/00* (2006.01)

(52) U.S. Cl.
CPC .......... *B81C 1/00595* (2013.01); *B81B 7/007* (2013.01); *B81C 1/00357* (2013.01);
(Continued)

(58) Field of Classification Search
CPC ............ B81C 1/00563; B81C 1/00595; B81C 1/00801; B81C 2201/0132; B81C 1/00357; H01L 21/02016; H01L 21/3065; H01L 21/30655; H01L 21/32136; H01L 21/32137
See application file for complete search history.

(56) References Cited

U.S. PATENT DOCUMENTS

| 5,122,856 A | 6/1992 | Komiya |
| 5,573,679 A | 11/1996 | Mitchell et al. |

(Continued)

OTHER PUBLICATIONS

Notice of Allowance dated Apr. 20, 2017 for U.S. Appl. No. 14/699,094.

*Primary Examiner* — Joshua King
(74) *Attorney, Agent, or Firm* — Eschweiler & Potashnik, LLC (57) ABSTRACT

An integrated circuit (IC) device is provided. The IC device includes a first die including a first substrate and a second die including a second substrate. A plasma-reflecting layer is included on an upper surface of the first die. The plasma-reflecting layer is configured to reflect a plasma therefrom. The second substrate is bonded to the first die so as to form a cavity, wherein a lower surface of the cavity is lined by the plasma-reflecting layer. A dielectric protection layer is present on a lower surface of the second die and lines the upper surface of the cavity. A material of the second substrate has a first etch rate for the plasma and a material of the dielectric protection layer has a second etch rate for the plasma. The second etch rate is less than the first etch rate.

20 Claims, 6 Drawing Sheets

(52) U.S. Cl.
CPC ............... *B81B 2201/0235* (2013.01); *B81B 2201/0242* (2013.01); *B81B 2201/0264* (2013.01); *B81B 2201/0271* (2013.01); *B81B 2201/0292* (2013.01); *B81C 2201/0132* (2013.01)

(56) References Cited

U.S. PATENT DOCUMENTS

| | | | |
|---|---|---|---|
| 5,841,197 A * | 11/1998 | Adamic, Jr. | H01L 21/2007 257/777 |
| 7,595,209 B1 | 11/2009 | Monadgemi et al. | |
| 8,993,362 B1 | 3/2015 | Flannery, Jr. | |
| 2003/0118277 A1 | 6/2003 | Yu et al. | |
| 2003/0141561 A1 * | 7/2003 | Fischer | B81C 1/00801 257/415 |
| 2005/0085052 A1 | 4/2005 | Chen et al. | |
| 2005/0121413 A1 | 6/2005 | Weekamp | |
| 2005/0124159 A1 * | 6/2005 | Kalvesten | B81C 1/00142 438/689 |
| 2008/0141759 A1 * | 6/2008 | Reinert | G01M 3/186 73/40 |
| 2008/0311751 A1 | 12/2008 | Laermer et al. | |
| 2010/0075481 A1 * | 3/2010 | Yang | B81C 1/00246 438/458 |
| 2010/0193884 A1 | 8/2010 | Park et al. | |
| 2010/0323524 A1 | 12/2010 | Yoshida | |
| 2011/0027941 A1 * | 2/2011 | Kumar | B81C 1/00246 438/106 |
| 2011/0260268 A1 | 10/2011 | Lee et al. | |
| 2011/0293128 A1 | 12/2011 | Kuratani et al. | |
| 2012/0050751 A1 * | 3/2012 | Blomberg | B81B 3/0013 356/519 |
| 2012/0142144 A1 | 6/2012 | Taheri | |
| 2012/0248615 A1 * | 10/2012 | Chien | B81C 1/0023 257/770 |
| 2012/0280594 A1 | 11/2012 | Chen et al. | |
| 2013/0099355 A1 | 4/2013 | Liu et al. | |
| 2013/0230939 A1 | 9/2013 | Lee | |
| 2013/0236988 A1 | 9/2013 | Sridharamurthy et al. | |
| 2015/0102437 A1 | 4/2015 | Liu et al. | |
| 2015/0122038 A1 * | 5/2015 | Mayer | G01L 19/146 73/715 |
| 2015/0122042 A1 * | 5/2015 | Lin | B23P 19/04 73/754 |
| 2015/0329351 A1 | 11/2015 | Cheng et al. | |
| 2015/0375995 A1 * | 12/2015 | Steimle | B81C 1/00238 257/418 |
| 2016/0318758 A1 * | 11/2016 | Chou | B81C 1/00619 |
| 2016/0332867 A1 | 11/2016 | Tseng et al. | |

* cited by examiner

STRUCTURE TO REDUCE BACKSIDE SILICON DAMAGE

REFERENCE TO RELATED APPLICATION

This Application is a Divisional of U.S. application Ser. No. 14/699,094 filed on Apr. 29, 2015, the contents of which are hereby incorporated by reference in their entirety.

BACKGROUND

Microelectromechanical system (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to complementary metal-oxide semiconductor (CMOS) devices to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

MEMS devices often utilize deflectable elements such as cantilever-type structures, flexible membranes, etc., that are free to bend and whose movement is detected by electrodes. For motion-sensing MEMS devices, the deflectable element is commonly referred to as a proof mass, and for pressure sensing MEMS devices, the movable element is commonly referred to as a flexible membrane or diaphragm. Fabrication of these deflectable elements or MEMS structures frequently requires etching of deep trenches in a MEMS substrate, which is usually a Silicon (Si) substrate. In order to accomplish such deep etching with precision, a plasma etching technique is often utilized.

For many applications, MEMS devices are electrically connected to, and packaged with, application-specific integrated circuits (ASICs) or processors, such as microcontrollers, that serve as interfaces between the MEMS devices and electronic devices. These ASICs or processors are typically implemented as complementary metal-oxide semiconductor (CMOS) logic designs. A CMOS wafer includes different layers of plasma-reflecting surfaces, like for e.g., sensing plates, contact pads, etc. disposed on an upper surface of the CMOS wafer, that are capable of reflecting a plasma incident on their surface. Cavities are formed between a lower surface of the MEMS wafer and an upper surface of the CMOS wafer during the bonding process. These cavities allow MEMS deflectable elements to move freely within a MEMS-CMOS package and perform the desired function of the MEMS device. Most of the MEMS structures or deflectable elements are formed after bonding a MEMS wafer with the CMOS wafer.

A challenge with forming MEMS structures using a plasma etching process is that, after forming the deep trenches or openings in the MEMS wafer, the plasma will move through the cavity and rebound from the plasma-reflecting surfaces (sensing plates). Such rebound plasma will strike the lower surface of the MEMS wafer, causing damage to the lower surface. Etch damage induced by reactive plasma can cause the proof mass to sink down, which will affect the performance of the MEMS device negatively. Plasma-induced damage includes trapped interface charges, material defects migration into bulk materials, and contamination caused by the deposition of etch-products on material surfaces.

In view of the foregoing, the present disclosure is directed to a method of forming a dielectric protection layer on the lower surface of the MEMS wafer before bonding/packaging it with a CMOS wafer. In some embodiments, the method includes receiving a first wafer including a first substrate and including a plasma-reflecting layer disposed on an upper surface thereof. The plasma-reflecting layer is configured to reflect a plasma therefrom. A dielectric protection layer is formed on a lower surface of a second wafer, wherein the second wafer includes a second substrate. The second wafer is bonded to the first wafer, such that a cavity is formed between the plasma-reflecting layer and the dielectric protection layer when the first and second wafers are bonded together. An etch process is performed with the plasma, to form an opening extending from an upper surface of the second wafer and through the dielectric protection layer into the cavity.

Advantageously, the dielectric protection layer has a lower etch rate for the plasma than the second substrate, and will thereby protect the lower surface of the second substrate from plasma induced damage. An intensity of the rebound plasma is also less when compared with an intensity of the incident plasma, such that it causes little or no damage to the dielectric protection layer. Thus, the dielectric protection layer mitigates backside silicon damage of a MEMS wafer in an integrated circuit device.

Figure 1A:
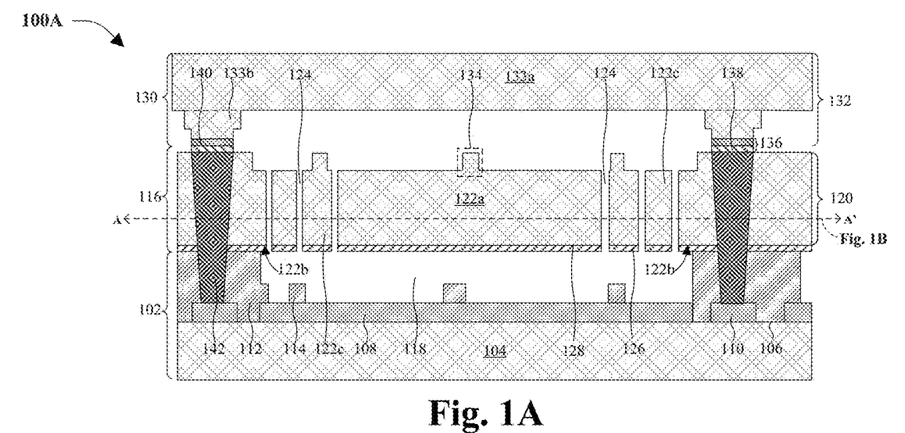
FIG. 1A illustrates a cross-sectional view of some embodiments of an integrated circuit device, including a dielectric protection layer on a lower surface of a semiconductor die, according to aspects of the present disclosure.

With reference to FIG. 1A, a cross-sectional view 100A of some embodiments of an integrated circuit (IC) device is provided. The IC device includes a first die 102, which includes a first substrate 104. The first die 102 supports MEMS operations and is, for example, a complementary metal-oxide semiconductor (CMOS) die. The first substrate 104 is, for example, a bulk semiconductor substrate of silicon or a semiconductor-on-insulator (SOI) substrate. The first substrate 104 has an upper surface 106, over which a plasma-reflecting layer 108 is disposed. The plasma-reflecting layer 108 has an inherent oscillation frequency greater than that of a plasma. Any wave having a frequency less than an inherent oscillation frequency of a material will be reflected from a surface of that material, and thus, the plasma has a frequency that is less than the inherent oscillation frequency of the plasma-reflecting layer. In some embodiments, the plasma-reflecting layer 108 is a sensing plate composed of a metal. The upper surface 106 further has one or more contact pads 110 disposed within an interlayer dielectric (ILD) layer 112. The one or more contact pads 110 electrically couple the first die 102 with the rest of the device. In some embodiments, the plasma-reflecting layer 108 and the contact pads 110 are conductive and are or otherwise include, for example, one or more of copper, aluminum, aluminum copper, tungsten, or another metal. Protruding dielectric structures 114 are seen above the plasma-reflecting layer 108. These are stoppers for an immediately overlying die (MEMS die) formed above the first die 102, that are integrated within the first die 102. These stoppers ensure that a necessary spacing is retained between the immediately overlying die and the first die 102, and thus helps in the proper functioning of the IC device. The ILD layer 112 and the protruding dielectric structures 114 are or otherwise includes, for example, a low-κ dielectric (i.e., a dielectric with a dielectric constant κ less than 3.9), or silicon dioxide.

A second die 116 is arranged over the first die 102, enclosing a cavity 118 between the first and second dies 102, 116. In some embodiments, the second die 116 corresponds to a MEMS die, such that the IC device corresponds to, for example, a motion sensor, a pressure sensor, or a microphone. The second die 116 includes a second substrate 120 arranged over and bonded to the first die 102 through the ILD layer 112. The ILD layer 112 provides spacing between the second substrate 120 and the first substrate 104, and facilitates bonding of the second substrate 120 to the first substrate 104, typically by a fusion bond. The ILD layer 112 extends along sidewalls of cavity 118. The second substrate 120 is, for example, a bulk semiconductor substrate, an SOI substrate, or a polysilicon-on-insulator (POI) substrate. The bulk semiconductor substrate is typically a bulk silicon substrate, but it can also be or otherwise include other materials, such as germanium, silicon carbide, a group III element, a group IV element, or the like.

A deflectable element 122a of the IC device is integrated into the second substrate 120 over the cavity 118, and an anchor 122b of the second die 116 is integrated into the second substrate 120 around the periphery of the cavity 118 to support the deflectable element 122a. Where the IC device corresponds to a motion sensor or a microphone, the deflectable element 122a is often referred to as a proof mass, and where the IC device corresponds to a pressure sensor, the deflectable element 122a is often referred to as a flexible membrane or diaphragm. In some embodiments, the deflectable element 122a is electrically coupled to the first substrate 104 and serves as an electrode. Further, in some embodiments, such as where the IC device is a motion sensor or a microphone, the second die 116 further includes one or more support arms or springs 122c integrated into the second substrate 120 and suspending the deflectable element 122a over the cavity 118.

In operation, the deflectable element 122a deflects in proportion to external stimuli, such as motion, sound waves or pressure, whereby the external stimuli can be quantified by measuring the deflection. For example, where the IC device is a pressure sensor, the deflectable element 122a can seal the cavity 118 with a reference pressure. The deflectable element 122a thereafter deflects in proportion to the deviation between the reference pressure and an environmental pressure on an opposite side of the deflectable element 122a as the reference pressure. As another example, where the IC device is a motion sensor or microphone, the deflectable element 122a deflects in proportion to motion applied to the IC device or sounds waves hitting the deflectable element 122a. Regardless of the mechanism by which the deflectable element 122a deflects, the sensing electrodes cooperate with the deflectable element 122a to quantify the deflection using capacitive coupling there between. The protruding dielectric structures 114 stop the deflectable element 122a from over-extending in the vertical direction towards the first substrate 104. This advantageously reduces the likelihood of damage to the IC device and increases the useful life of the IC device.

Deep openings 124 exist between the deflectable element 122a and the one or more springs 122c. A plasma etch is usually utilized to form these deep openings 124. Plasma etching involves ions, free radicals and electrons in a plasma gas, which react chemically with a material of the second substrate 120 to form residual products that leave the second substrate 120 surface and thus, etch the material from the second substrate 120. This plasma, having sufficient intensity to form the deep openings 124, will move through the cavity 118, rebound from the plasma-reflecting layer 108, and hit the lower surface 128 of second substrate 120. A dielectric protection layer 126 is disposed on the lower surface 128 of the second substrate, for protecting the lower surface of the second substrate 128 from plasma damage. In some embodiments, the dielectric protection layer 126 comprises one or more of an oxide, an oxynitride, a nitride, or a low-k dielectric. The dielectric protection layer 126 has a first etch rate for plasma and the second substrate 120 has a second etch rate for plasma.

Advantageously, the first etch rate is lower than the second etch rate, which protects the second substrate 120 from the plasma that rebounds after hitting the plasma-reflecting layer 108.

A third die 130 is arranged over the second die 116 and includes a third substrate 132 arranged over and bonded to the second substrate 120. In some embodiments, the third die 130 is a cap die. The third substrate 132 includes a base region 133a having a generally uniform thickness and a mounting region 133b extending vertically from the base region 133a. In some embodiments, the footprints of the mounting region 133b discretely taper towards the second substrate 120. In some embodiments, stopper regions 134 are formed over the second substrate 120. Stoppers are often formed from oxide and/or metal. The stopper regions 134 provide necessary spacing between the deflectable elements 122a and the one or more springs 122c from the third die 130. The third substrate 132 may be, for example, a bulk semiconductor substrate or an SOI substrate.

A eutectic bonding ring structure 136 bonds the second substrate 120 to the third substrate 132. The eutectic bonding ring structure 136 includes a first eutectic bonding ring 138 on the second substrate 120 and a second eutectic bonding ring 140 on the third die 130. The first eutectic bonding ring 138 is arranged on a top surface of the second substrate 120 around the periphery of the cavity 118, and a second eutectic bonding ring 140 is arranged on a bottom surface of the mounting region 133b of the third substrate 132. The first and second eutectic bonding rings 138, 140 have substantially the same footprints and interface to define a eutectic bond at the interface therebetween. The first eutectic bonding ring 138 is or otherwise includes, for example, aluminum copper, and the second eutectic bonding ring 140 is or otherwise includes, for example, germanium. Further, through substrate vias (TSV) 142 extend from an upper surface of the second substrate 120 through the second substrate 120, through the dielectric protection layer 126, and through the ILD layer 112, to land on contact pads 110. The TSV 142 provides electrical coupling between the first, second and third dies 102, 116, and 130.

Figure 1B:
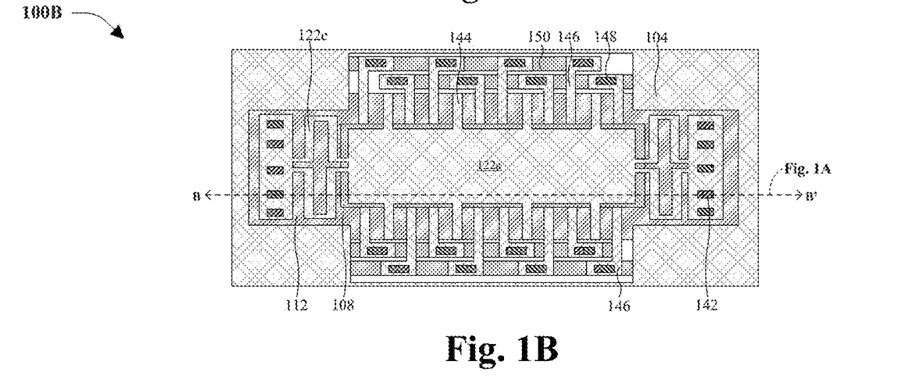
FIG. 1B illustrates a top view of some embodiments of the integrated circuit device of FIG. 1A.

With reference to FIG. 1B, a top view 100B of some embodiments of the IC device of FIG. 1A taken along line A-A' is provided, where FIG. 1A is taken along line B-B' of FIG. 1B.

As illustrated in FIG. 1B, deflectable element 122a includes fingers 144, which are interdigitated with fingers 146 of the second substrate 120. The dielectric protection layer 126 and the cavity 118 are disposed below the deflectable element 122a (out of illustrated view). Sensing pads 148 are disposed at the end of fingers 144 and 146, to sense any deflection proportional to external stimuli, such as motion, sound waves or pressure. Bottom plates 150 are disposed below the sensing pads 148 whereby the external stimuli can be quantified by measuring the deflection.

Figure 2:
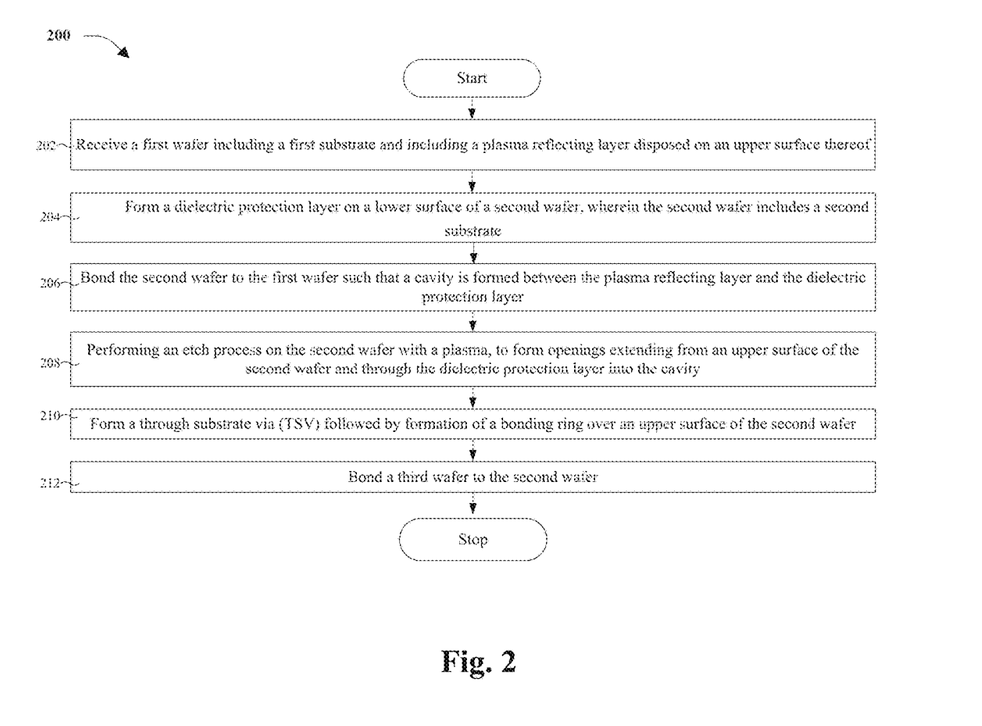
FIG. 2 illustrates a flow chart of some embodiments of a method of manufacturing an integrated circuit device including a dielectric protection layer on a lower surface of semiconductor die, according to aspects of the present disclosure.

With reference to FIG. 2, a flow chart 200 provides some embodiments of a method for manufacturing an IC device, including a dielectric protection layer on a lower surface of a semiconductor wafer, according to aspects of the present disclosure.

At 202, a first wafer is received, which includes a first substrate and a plasma-reflecting layer disposed on an upper surface thereof.

At 204, a dielectric protection layer is formed on a lower surface of a second wafer, wherein in the second wafer includes a second substrate.

At 206, the second wafer is bonded to the first wafer, such that a cavity is formed between the plasma-reflecting layer and the dielectric protection layer.

At 208, an etch process is performed on the second wafer with a plasma, to form openings that extend from an upper surface of the second wafer and through the dielectric protection layer into the cavity.

At 210, a through substrate via and a first eutectic bonding ring are formed over the second wafer.

At 212, a third wafer is bonded to the second wafer through eutectic bonding.

Advantageously, forming the dielectric protection layer on the lower surface of the second wafer protects the second wafer from the plasma that rebounds from the plasma-reflecting layer, thereby preventing plasma induced damage on the lower surface of the second wafer.

While the disclosed method 200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 3-9, cross-sectional views of some embodiments of a semiconductor structure at various stages of manufacture are provided to illustrate the method of FIG. 2. Although FIGS. 3-9 are described in relation to the method, it will be appreciated that the structures disclosed in FIGS. 3-9 are not limited to the method, but instead may stand alone as structures independent of the method. Similarly, although the method is described in relation to FIGS. 3-9, it will be appreciated that the method is not limited to the structures disclosed in FIGS. 3-9, but instead may stand alone independent of the structures disclosed in FIGS. 3-9.

Figure 3:
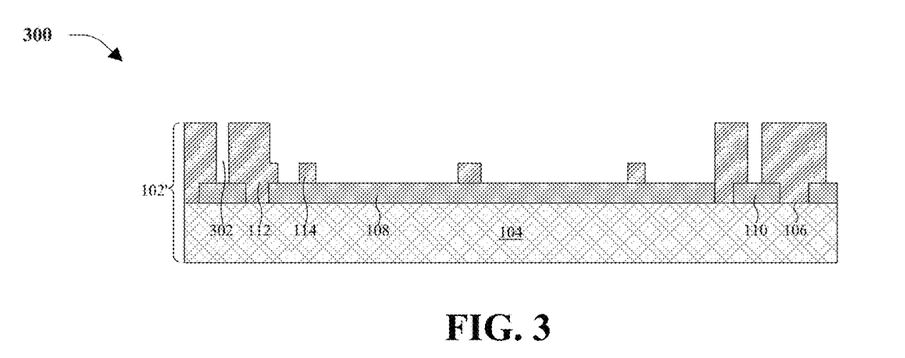
FIGS. 3-9 illustrate a series of incremental manufacturing steps as a series of cross-sectional views, according to the method of FIG. 2.

FIG. 3 illustrates a cross-sectional view 300 of some embodiments corresponding to Act 202 of FIG. 2.

As illustrated in FIG. 3, complementary metal-oxide semiconductor (CMOS) wafer 102', which includes a first substrate 104 and which forms the base structure for an IC device, is provided. In some embodiments, the CMOS wafer 102' is a CMOS wafer, and the first substrate 104 is, for example, a bulk semiconductor substrate of silicon or a semiconductor-on-insulator (SOI) substrate. The first substrate 104 has an upper surface 106, over which a plasma-reflecting layer 108 is disposed. In some embodiments, the plasma-reflecting layer 108 is a sensing plate composed of a metal. The upper surface 106 further has one or more contact pads 110 disposed within an interlayer dielectric (ILD) layer 112. The one or more contact pads 110 electrically couple the CMOS wafer 102' with the rest of the IC device. In some embodiments, the plasma-reflecting layer 108 and the contact pads 110 are conductive and are or otherwise include, for example, one or more copper, aluminum, aluminum copper, tungsten, or another metal. Protruding dielectric structures 114 are seen above the plasma-reflecting layer 108. These are MEMS stoppers that are integrated within the CMOS wafer 102', protruding from the plasma-reflecting layer 108. These MEMS stoppers ensure that a necessary spacing is retained between deflecting elements of an overlying MEMS wafer and the CMOS wafer 102', and thus helps in proper functioning of the IC device. The ILD layer 112 and the protruding dielectric structures 114 are or otherwise includes, for example, a low-κ dielectric (i.e., a dielectric with a dielectric constant κ less than 3.9), or silicon dioxide. An ILD opening 302 is formed within the ILD layer 112 on either side of the plasma-reflecting layer 108. These ILD openings 302, help in formation of contact vias at a later stage of processing.

Figure 4:
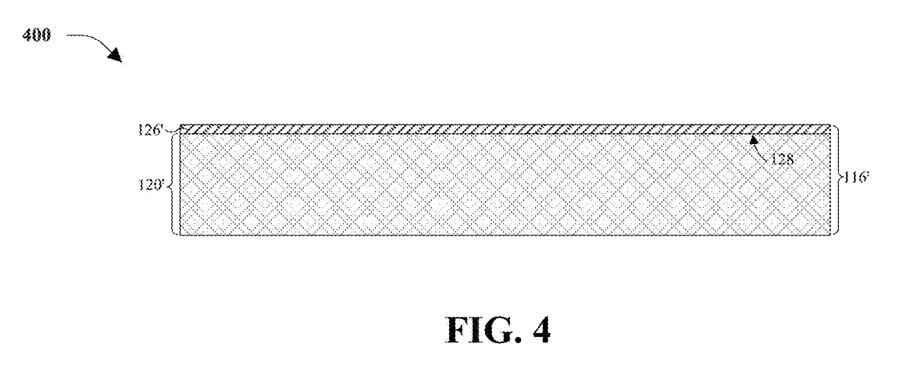

FIG. 4 illustrates a cross-sectional view 400 of some embodiments corresponding to Act 204 of FIG. 2.

As illustrated in FIG. 4, a MEMS wafer 116' is provided. The MEMS wafer 116' includes a dielectric protection layer 126' formed on a lower surface 128 of a MEMS substrate 120'. The MEMS substrate 120' is, for example, a bulk semiconductor substrate, an SOI substrate, or a polysilicon-on-insulator (POI) substrate. In some embodiments, the dielectric protection layer 126' comprises one or more of an oxide, an oxynitride, a nitride, or a low-k dielectric.

Figure 5:
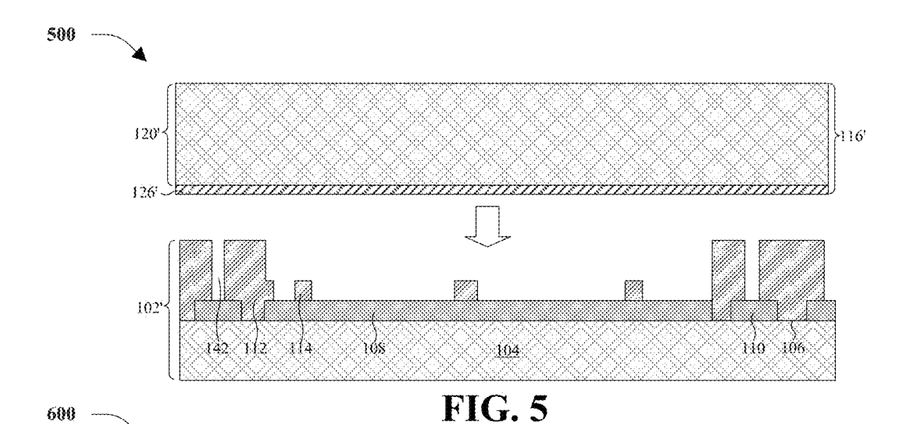
Figure 6:
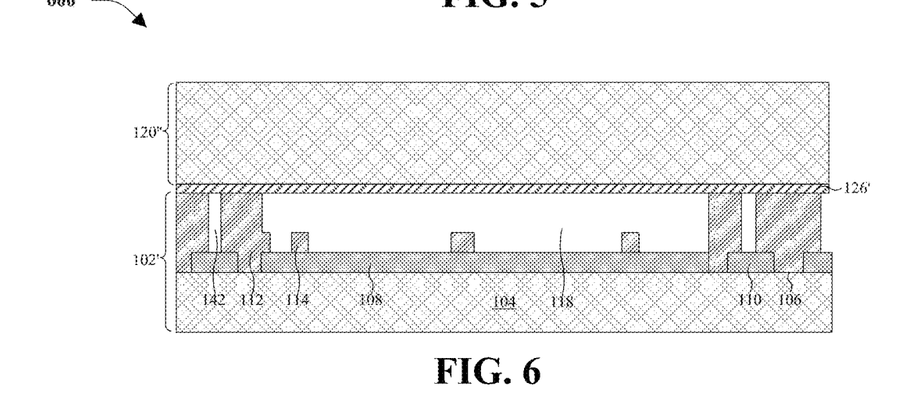

FIGS. 5-6 illustrate cross-sectional views 500 and 600 of some embodiments corresponding to Act 206 of FIG. 2.

As illustrated in FIG. 5, the MEMS wafer 116' of FIG. 4 is flipped and bonded with the CMOS wafer 102', in such a way that the dielectric protection layer 126' faces the plasma-reflecting layer 108.

As illustrated in FIG. 6, the bonding of the MEMS wafer 116' and the CMOS wafer 102' results in the formation of a cavity 118, which is surrounded by the dielectric protection layer 126' on an upper side, the plasma-reflecting layer 108 on a lower side, and the ILD layer 112 on two lateral sides. The ILD layer 112 provides spacing between the MEMS substrate 120' and the first substrate 104, and facilitates bonding of the MEMS substrate 120' to the first substrate 104, typically by a fusion bond.

Figure 7:
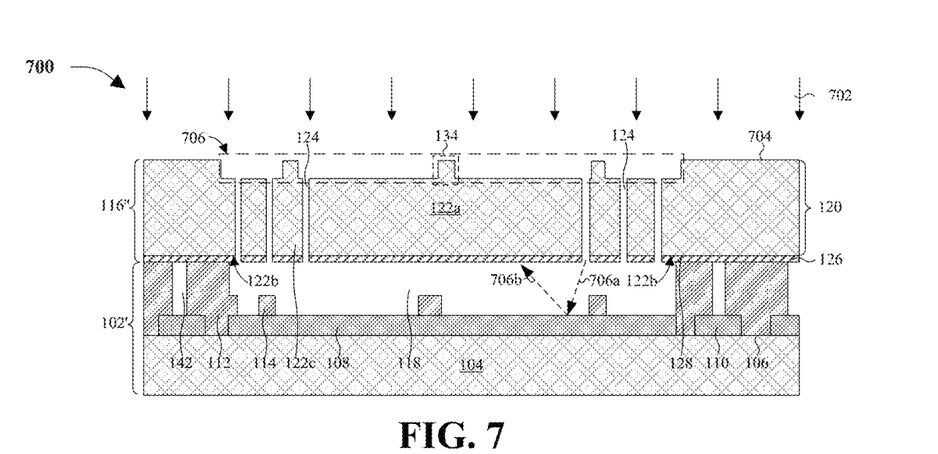

FIG. 7 illustrates a cross-sectional view 700 of some embodiments corresponding to Act 208 of FIG. 2.

As illustrated in FIG. 7, a plasma etch 702 is performed into the MEMS substrate 120' to form a deflectable element 122a suspended over the cavity 118. After the plasma etch 702, the MEMS substrate is labeled as 120 and the MEMS wafer is labeled as 116". The plasma etch 702 further results in formation of an anchor 122b integrated into the MEMS substrate 120 around the periphery of the cavity 118, to support the deflectable element 122a. In some embodiments, the plasma etch 702 also forms one or more springs 122c suspending the deflectable element 122a over the cavity 118. Further, in some embodiments, the process for the plasma etch 702 includes forming a photoresist layer over the MEMS substrate 120, patterning the photoresist layer to expose regions of the MEMS substrate 120' surrounding the deflectable element 122a and/or the springs 122c; applying a plasma etchant to the patterned photoresist layer and the MEMS substrate 120'; and removing the patterned photoresist layer to expose the deflectable element 122a and/or the springs 122c.

Formation of the deflectable element 122a and the one or more springs 122c results in deep openings 124 that extend from an upper surface 704 of the MEMS substrate 120, through the dielectric protection layer 126 into the cavity 118. The plasma gas that reacts with a material (Si) of the MEMS substrate 120 to form these deep openings 124, and as shown by arrow 706a, will further move in to the cavity 118, strike on the plasma-reflecting layer 108 disposed over the first substrate 104, and get reflected. The rebound plasma 706b will hit the dielectric protection layer 126. Since the rebound plasma has an intensity less than the originally incident plasma, the dielectric protection layer 126 will be left substantially intact and will not be etched or damaged by the rebound plasma. By comparison, in previous approaches where dielectric protection layer 126 was not present, the lowermost surface of the MEMS substrate 120 was left with damage, such as divots or recesses, due to the rebound plasma 706b.

Thus, the dielectric protection layer 126 protects the lower surface of the MEMS substrate 128 from any plasma induced damage. Further, the dielectric protection layer 126 has a lower etch rate for plasma, when compared with an etch rate of the MEMS substrate 120 for plasma.

In some embodiments, a first etch (not shown) is performed before performing the plasma etch 702, to recess a central region 706 and stopper regions 134 of the MEMS substrate 120'. The first etch includes, for example, one or more sub-etches, each of which is anisotropic, isotropic, or a combination of anisotropic and isotropic, and each of which is a wet etch, a dry etch (e.g., a plasma etch), or a combination of wet and dry etches.

Figure 8:
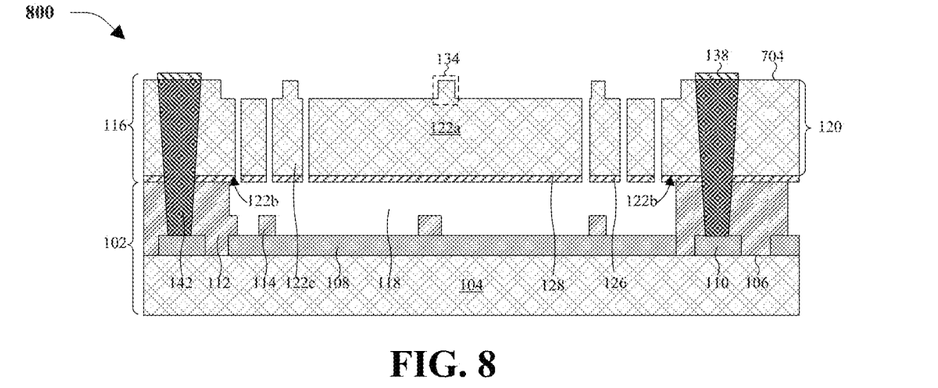

FIG. 8 illustrates a cross-sectional view 800 of some embodiments corresponding to Act 210 of FIG. 2.

As illustrated in FIG. 8, a through substrate via (TSV) 142 is formed extending from the upper surface 704 of the MEMS substrate 120, through the dielectric protection layer 126, and through the ILD layer 112, landing on the one or more contact pads 110. The TSVs 142 provide electrical coupling between the various vertical layers of the IC device. In some embodiments, the TSV 142 may comprise polysilicon or metal, such as tungsten, copper, or aluminum. A first eutectic bonding ring 138 is arranged on a top surface of the MEMS substrate 120 around the periphery of the cavity 118. The first eutectic bonding ring 138 is or otherwise includes, for example, aluminum copper. Following the formation of the first eutectic bonding ring 138, the MEMS wafer is given the reference numeral 116.

Figure 9:
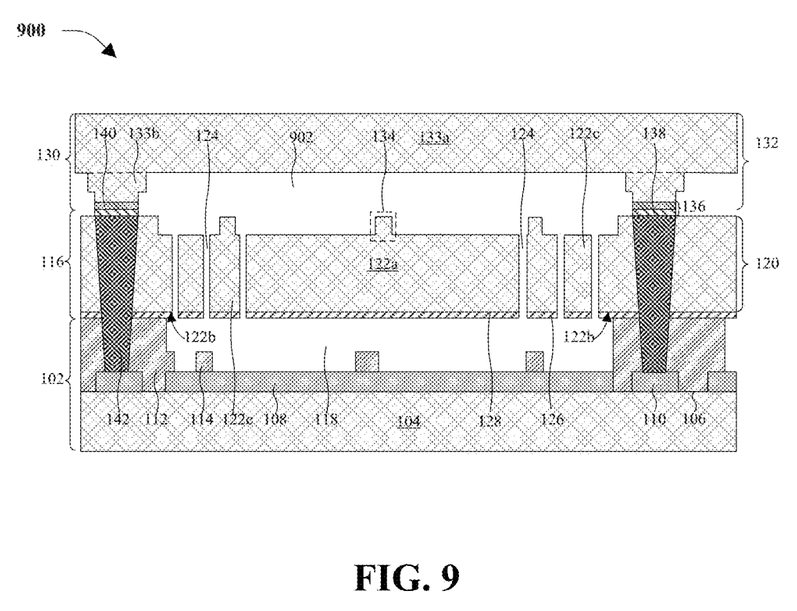

FIG. 9 illustrates a cross-sectional view 900 of some embodiments corresponding to Act 212 of FIG. 2.

As illustrated in FIG. 9, a cap wafer 130 is bonded over the MEMS wafer 116 through eutectic bonding ring structures 136. The bonding ring 136 includes the first eutectic bonding ring 138 of the MEMS wafer 116 and a second eutectic bonding ring 140 of the cap wafer 130. In some embodiments, the second eutectic bonding ring 140 is or otherwise includes, for example, germanium. The first and second eutectic bonding rings 138, 140 have substantially the same footprints and interface to define a eutectic bond at the interface therebetween. During eutectic bonding, an incremental thermal energy is supplied to the first and second eutectic bonding rings 138, 140 to promote a solder melting process and thus form a eutectic bond between the MEMS and cap wafers 116, 130. The cap wafer 130 includes a cap substrate 132, which includes a base region 133a having a generally uniform thickness and a mounting region 133b extending vertically from the base region 133a. In some embodiments, the footprints of the mounting region 133b discretely taper towards the MEMS substrate 120. The cap substrate 132 may be, for example, a bulk semiconductor substrate or an SOI substrate.

When the cap wafer 130 is arranged over and secured to the MEMS wafer 116, chambers 902 including the deep openings 124 are formed over and abutting corresponding MEMS devices between the MEMS and cap wafers 116, 130. The combined MEMS and cap wafers 116, 130 are then singulated or diced to form individual MEMS dies, each including at least one MEMS device.

Similar to MEMS devices, during the bulk manufacture of CMOS devices, a plurality of CMOS devices is formed over and/or within an CMOS wafer, typically 12 inches in diameter. Further, the plurality of CMOS devices is typically formed using complementary metal-oxide-semiconductor (CMOS) technology. The CMOS wafer is then singulated or diced to form individual CMOS dies, each including at least one CMOS.

Thus, as can be appreciated from above, the present disclosure provides a method of forming an IC (integrated circuit) device. The method includes, receiving a first wafer including a first substrate and including a plasma-reflecting layer disposed on an upper surface thereof. The plasma-reflecting layer is configured to reflect a plasma therefrom. A dielectric protection layer is formed on a lower surface of a second wafer, wherein the second wafer includes a second substrate. The second wafer is bonded to the first wafer, such that a cavity is formed between the plasma-reflecting layer and the dielectric protection layer. An etch process is performed with the plasma to form an opening extending from an upper surface of the second wafer and through the dielectric protection layer into the cavity.

In other embodiments, the present disclosure provides an integrated circuit (IC) device including a first die. The first die includes a first substrate and a plasma-reflecting layer on an upper surface of the first die, wherein the plasma-reflecting layer is configured to reflect a plasma therefrom. A second die including a second substrate is bonded to the first die so as to form a cavity bounded by the first die and the second die. A dielectric protection layer is disposed on a lower surface of the second die, lining the upper surface of the cavity. A material of the second substrate has a first etch rate for the plasma and a material of the dielectric protection layer has a second etch rate for the plasma. The second etch rate is less than the first etch rate.

In yet other embodiments, the present disclosure provides A microelectromechanical systems (MEMS) package, comprising, a CMOS die including a CMOS substrate and including a plasma-reflecting metal layer on an upper surface thereof. The plasma-reflecting metal layer is configured to reflect a plasma therefrom. A MEMS die including a MEMS substrate is bonded to the CMOS die so as to form a cavity bounded by the CMOS and MEMS dies. A protecting oxide layer disposed on a lower surface of the MEMS die, lining the upper surface of the cavity. A material of the MEMS substrate has a first etch rate for the plasma etchant, and the protecting oxide layer has a second etch rate for the plasma etchant. The second etch rate is less than the first etch rate. Openings extend from an upper surface of the MEMS die through the lower surface and through the protecting oxide layer, into the cavity. An inter-layer dielectric (ILD) layer is disposed over the CMOS substrate, and extends along sidewalls of the cavity. A cap die is bonded to the upper surface of the MEMS die through bonding structures. Through substrate vias (TSV) extend from the upper surface of the MEMS die to contact pads disposed over the CMOS substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device comprising:
   a first die including a first substrate and including a plasma-reflecting layer on an upper surface of the first die, wherein the plasma-reflecting layer is configured to reflect a plasma therefrom;
   a second die including a second substrate and bonded to the first die so as to form a cavity bounded by the first die and the second die, wherein a lower surface of the cavity is lined by the plasma-reflecting layer; and
   a dielectric protection layer on a lower surface of the second die and lining the upper surface of the cavity, wherein a material of the second substrate has a first etch rate for the plasma and a material of the dielectric protection layer has a second etch rate for the plasma, the second etch rate being less than the first etch rate.

2. The IC device of claim 1, further including openings that extend from an upper surface of the second die, through the lower surface of the second die, and through the dielectric protection layer, into the cavity.

3. The IC device of claim 1, further comprising an inter-layer dielectric (ILD) layer extending along sidewalls of the cavity.

4. The IC device of claim 3, wherein the dielectric protection layer and the plasma-reflecting layer extend continuously over entire surfaces of the second substrate and the first substrate, respectively, between inner sidewalls of the ILD layer.

5. The IC device of claim 3, wherein:
   the first substrate and the second substrate comprise silicon;
   the plasma-reflecting layer comprises a metal;
   the ILD layer comprises an oxide; and
   the dielectric protection layer comprises one or more of an oxide, an oxynitride, a nitride, or a low-k dielectric.

6. The IC device of claim 1, wherein a thickness of the dielectric protection layer ranges between approximately 20 Angstroms and approximately 500 Angstroms.

7. The IC device of claim 1 further including a third die bonded to the upper surface of the second die.

8. The IC device of claim 7, further including:
   a through substrate via (TSV) that extends from the upper surface of the second die to a metal contact pad arranged over the first substrate; and
   a bonding structure between the second die and the third die.

9. The IC device of claim 1, wherein the second die includes one of an accelerometer, a magnetic sensor, a gyroscope, a pressure sensor, a magnetic sensor, and a radio frequency (RF) resonator.

10. A microelectromechanical systems (MEMS) package, comprising:
    a complementary metal oxide semiconductor (CMOS) die including a CMOS substrate and including a plasma-reflecting metal layer on an upper surface of the CMOS substrate, wherein the plasma-reflecting metal layer is configured to reflect a plasma therefrom;
    a MEMS die including a MEMS substrate and bonded to the CMOS die so as to form a first cavity bounded by the MEMS die and the CMOS die;
    a protective oxide layer disposed on a lower surface of the MEMS die and lining an upper surface of the first cavity, wherein a material of the MEMS substrate has a first etch rate for the plasma, and the protective oxide layer has a second etch rate for the plasma, the second etch rate being less than the first etch rate; and
    an opening extending from an upper surface of the MEMS die through the lower surface of the MEMS die and through the protective oxide layer, into the first cavity.

11. The MEMS package of claim 10, wherein the opening consists of an air gap.

12. The MEMS package of claim 10, further comprising: a cap die bonded to the upper surface of the MEMS die through a bonding structure so as to form a second cavity between the upper surface of the MEMS die and a lower surface of the cap die.

13. The MEMS package of claim 12, wherein the opening connects the first cavity and the second cavity to one another.

14. The MEMS package of claim 10, further comprising: an inter-layer dielectric (ILD) layer disposed over the CMOS substrate, and extending along sidewalls of the first cavity;
a cap die bonded to the upper surface of the MEMS die through a bonding structure; and
a through substrate via (TSV) extending from the upper surface of the MEMS die to a contact pad disposed over the CMOS substrate.

15. The MEMS package of claim 10, further comprising protruding dielectric structures disposed over the plasma-reflecting layer, and extending into the first cavity.

16. A semiconductor package assembly, comprising:
a first substrate including an upper surface and a lower surface;
a second substrate arranged over the first substrate and including an upper surface and a lower surface, wherein the lower surface of the second substrate is bonded to the upper surface of the first substrate so as to form a first cavity bounded by the first substrate and the second substrate;
a third substrate arranged over the second substrate and including an upper surface and a lower surface, wherein the lower surface of the third substrate is bonded to the upper surface of the second substrate so as to form a second cavity bounded by the second substrate and the third substrate;
a plasma-reflecting metal layer arranged on the upper surface of the first substrate and lining a lower surface of the first cavity, wherein the plasma-reflecting metal layer is configured to reflect a plasma therefrom;
a protective oxide layer disposed on a lower surface of the second substrate and lining an upper surface of the first cavity, wherein a material of the second substrate has a first etch rate for the plasma, and the protective oxide layer has a second etch rate for the plasma, the second etch rate being less than the first etch rate; and
an opening extending from an upper surface of the second substrate through the lower surface of the second substrate and through the protective oxide layer, into the first cavity.

17. The semiconductor package assembly of claim 16, further comprising a plurality of protruding dielectric structures disposed on an upper surface of the plasma-reflecting layer, and extending into the first cavity.

18. The semiconductor package assembly of claim 17, wherein:
the first substrate and the second substrate comprises silicon;
the plasma-reflecting metal layer comprises one or more of copper, aluminum, aluminum copper, or tungsten; and
the protective oxide layer comprises one or more of an oxide, an oxynitride, or a low-k dielectric.

19. The semiconductor package assembly of claim 18, wherein the opening consists of an air gap.

20. The semiconductor package assembly of claim 19, further including:
a through substrate via (TSV) that extends from the upper surface of the second substrate to a metal contact pad arranged over the first substrate; and
a eutectic bonding ring structure between the second substrate and the third substrate.

* * * * *